United States Patent
Arai et al.

(10) Patent No.: US 10,806,028 B2
(45) Date of Patent: Oct. 13, 2020

(54) METHOD FOR MANUFACTURING CERAMIC-METAL LAYER ASSEMBLY, METHOD FOR MANUFACTURING CERAMIC CIRCUIT BOARD, AND METAL-BOARD-JOINED CERAMIC BASE MATERIAL BOARD

(71) Applicant: MITSUBISHI MATERIALS CORPORATION, Tokyo (JP)

(72) Inventors: Koya Arai, Saitama (JP); Masahito Komasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/616,136

(22) PCT Filed: Jun. 11, 2018

(86) PCT No.: PCT/JP2018/022182
§ 371 (c)(1),
(2) Date: Nov. 22, 2019

(87) PCT Pub. No.: WO2019/003880
PCT Pub. Date: Jan. 3, 2019

(65) Prior Publication Data
US 2020/0146144 A1    May 7, 2020

(30) Foreign Application Priority Data
Jun. 27, 2017   (JP) ................................ 2017-124986

(51) Int. Cl.
*H05K 1/03*    (2006.01)
*H05K 3/00*    (2006.01)
(Continued)

(52) U.S. Cl.
CPC ......... *H05K 1/0306* (2013.01); *B23K 1/0016* (2013.01); *H05K 3/0017* (2013.01);
(Continued)

(58) Field of Classification Search
CPC .. H05K 3/0097; H05K 3/0052; H05K 1/0306; H05K 3/0029; H05K 3/0067
See application file for complete search history.

(56) References Cited

FOREIGN PATENT DOCUMENTS

JP    2005-057031 A    3/2005
JP    2009-252971 A    10/2009
(Continued)

OTHER PUBLICATIONS

International Search Report dated Aug. 14, 2018, issued for PCT/JP2018/022182.

*Primary Examiner* — Jeremy C Norris
(74) *Attorney, Agent, or Firm* — Locke Lord LLP

(57) ABSTRACT

Provided is a method for manufacturing a metal-layer-joined ceramic base material board, in which at least one scribe line is formed, on each of the front and back surfaces of a ceramic base material board, along dividing lines for dividing the ceramic base material board into a plurality of ceramic boards, a metal board covering at least a portion of the dividing lines is joined to each of the front and back surface of the ceramic base material board, the metal boards are etched along the dividing lines to form a plurality of metal layers, and the plurality of metal layers are joined to each of the front and back surfaces of the ceramic base material board.

17 Claims, 6 Drawing Sheets

(51) Int. Cl.
*B23K 1/00* (2006.01)
*B23K 103/00* (2006.01)
*B23K 101/42* (2006.01)

(52) U.S. Cl.
CPC ......... *H05K 3/0029* (2013.01); *H05K 3/0061* (2013.01); *B23K 2101/42* (2018.08); *B23K 2103/52* (2018.08); *H05K 2201/0909* (2013.01)

(56) References Cited

FOREIGN PATENT DOCUMENTS

| | | |
|---|---|---|
| JP | 2015-130432 A | 7/2015 |
| JP | 2015-185606 A | 10/2015 |

METHOD FOR MANUFACTURING CERAMIC-METAL LAYER ASSEMBLY, METHOD FOR MANUFACTURING CERAMIC CIRCUIT BOARD, AND METAL-BOARD-JOINED CERAMIC BASE MATERIAL BOARD

BACKGROUND OF THE INVENTION

Technical Field

The present invention is related to a method for manufacturing a ceramic-metal layer assembly in which the metal layers are joined on respective surfaces of a ceramic base material board, a method for manufacturing a ceramic circuit board by dividing the ceramic-metal layer assembly, and a metal-board-joined ceramic base material board in which metal boards are joined on both surfaces of the ceramic base material board.

Priority is claimed on Japanese Patent Application No. 2017-124986, filed Jun. 27, 2017, the content of which is incorporated herein by reference.

Background Art

Conventionally, it is proposed to use a ceramic circuit board that is obtained by dividing a joined assembly in which metal layers are joined on both surfaces of a ceramic board into pieces, as a wiring board of thermoelectric elements and LED elements.

In this joined assembly, joining of the ceramic board and the metal layers is carried out by using brazing material.

For instance, as a technique for joining the ceramic board and metal boards structuring the metal layers using the brazing material, the method for manufacturing a power module board is disclosed in Patent Document 1.

In the method for manufacturing the power module board described in Patent Document 1, laser light is emitted to a surface (one side) of a ceramic base material board having a large area which can be formed to multiple power module boards to form in advance scribe lines (dividing grooves) dividing the ceramic base material board into a size of the power module boards: metal plates made of aluminum or aluminum alloy are joined on both surfaces of the ceramic base material board using the brazing material of Al—Si base, then etching is carried out so as to remove the metal on the scribe lines: after that, the ceramic base material board is split along the scribe lines into pieces, and the respective power module boards are manufactured.

CITATION LIST

Patent Document

Patent Document 1: Japanese Unexamined Patent Application, First Publication No. 2015-185606

SUMMARY OF INVENTION

Technical Problem

In the method for manufacturing the power module board described in Patent Document 1, the metal boards are laminated on both surfaces of the ceramic base material board with the brazing material therebetween, and this laminated assembly is heated in a pressurized state by being held between carbon boards: the brazing material is melted and spread between the ceramic base material board and the metal boards, and Si atoms in the brazing material are dispersed into the metal boards: as a result, the ceramic base material board and the metal boards are joined.

On a front surface (a surface on which the scribe lines are formed) of the ceramic base material board, the melted brazing material is flown out from the laminated assembly along the scribe lines, so that braze lumps are generated at ends of the scribe lines. On the other side, on a back surface (a surface on which the scribe lines are not formed) of of the ceramic base material board, even if the melted brazing material is flown out, it is not so large quantity as on the surface on which the scribe lines are formed; and the braze lumps are generated at random positions of side surfaces of the laminated assembly.

In a case of the power module board in Patent Document 1, since the metal board (a metal layer) is relatively thick, it is not so obstructed by a difference of the flown out brazing material having or not having the scribe lines: however, if the metal board (the metal layer) is thin, there are the following problems.

On the front surface on which the scribe lines are formed, the larger quantity of the melted brazing material flows out of the laminated assembly along the scribe lines comparing to the back surface on which the scribe lines are not formed. Accordingly, the Si atoms are dispersed into the metal board at the back surface side with the larger number than that of the Si atoms in the brazing material dispersed into the metal board at the front surface side: content amount of the Si atoms are different.

Especially, smaller an area of the respective ceramic circuit boards, larger the number of the scribe lines formed on the ceramic base material board: and larger a difference between Si density of the metal board at the front surface side and Si density of the metal board at the back surface side of the ceramic base material board.

Etching rates of etching work after bonding the ceramic base material board and the metal boards are different between at the front and back surfaces: manufactured is a power module board having the metal layers with different areas between at the front and back surfaces.

In this case, the metal board at the back surface side has the higher Si density and lower melting point, so it is easier to be melted than the metal board at the front surface side. Accordingly, a liquid phase is generated on a surface of the metal board at the back surface side by heating for bonding and it becomes braze stains: if it is remarkable, there is a problem in that the carbon board is adhered to the metal board at the back surface side.

The present invention is achieved in consideration of the above circumstances, and has an object to reduce the difference of the Si density between the metal boards joined to the respective surfaces of the ceramic base material board, substantially equalize the etching rates of the respective metal boards, and reduce generation of the braze stain generated on the surfaces of the metal boards.

Solution to Problem

The present invention is a method for manufacturing a ceramic-metal layer assembly having: a step of forming scribe lines, forming at least one scribe line respective on a front surface and a back surface of a ceramic base material board along dividing lines for dividing the ceramic base material board into a plurality of ceramic boards; a step of joining, laminating a metal board made of aluminum or aluminum alloy with a thickness dimension of not more than 0.4 mm respective on each of the front surface and the back surface of the ceramic base material board with Al—Si base brazing material therebetween so as to cover at least a part of the dividing lines, and heating with pressurizing in a laminating direction; so that the metal boards are joined respectively on the front surface and the back surface of the ceramic base material board; and a step of etching, forming a plurality of metal layers by etching the metal boards along the dividing lines: thereby manufactured is the ceramic-metal layer assembly in which the plurality of metal layers are joined respectively on the front surface and the back surface of the ceramic base material board.

In a conventional case in which the scribe line is formed on only one surface of the ceramic base material board, more Si atoms in the brazing material are dispersed in the metal board joined on the back surface on which the scribe lines are not formed than the Si atoms in the brazing material dispersed in the metal board joined on the front surface on which the scribe lines are formed. Thereby the melting point of the metal board on the back surface side is reduced, so that the braze stain may be generated.

On the other hand, in the present invention, by forming the scribe lines on respective the front surface and the back surface of the ceramic base material board, when the metal boards are joined on both the surfaces of the ceramic base material board, it is possible to discharge surpluses of the melted brazing material to the outside of the laminated assembly along the scribe lines on both the surfaces. Accordingly, in comparing to a case in which the scribe lines are formed only on one surface, the difference of the content amount of the Si atoms (a difference of the Si density) dispersed from the brazing material is reduced between the metal boards on both the surfaces of the ceramic base material board: so that the metal boards can be etched at substantially the same etching rate, and it is possible to form the metal layers with substantially the same size.

Moreover, by forming the scribe lines on both the surface of the ceramic base material board, the surpluses of the melted brazing material on both the surfaces are smoothly discharged to the outside of the laminated assembly: as a result, it is possible to prevent the metal boards from generating a liquid phase because of falling of the melting point, and the braze stain on the surfaces of the metal boards can be suppressed.

In the method for manufacturing ceramic-metal layer assembly of the present invention, the plural scribe lines may be formed on respective the front surface and the back surface of the ceramic base material board.

By forming the plurality of scribe lines on both the surfaces of the ceramic base material board, the brazing material melted in the step of joining is easy to be discharged because it is dispersed to the outside of the laminated assembly on both the front surface and the back surface, and the Si density in the metal boards can be uniform in a surface direction. Since the Si density is uniform in the surface direction, the difference of the content amount of the Si atoms dispersed from the brazing material into the metal boards at the front surface side and the back surface side is small: accordingly, the metal boards on both the surfaces can be etched at the same etching rate, and the metal layers can be formed with substantially the same size.

Furthermore, since the melted brazing material is dispersed along the plurality of the scribe lines and discharged, the braze lumps can be suppressed from being larger.

In the method of manufacturing the ceramic-metal layer assembly of the present invention, it is preferable that in the step of forming scribe lines, the scribe lines that are formed on the front surface of the ceramic base material board and the scribe lines that are formed on the back surface of the ceramic base material board be a same number.

By forming the scribe lines with the same number on both the faces of the ceramic base material board, the amounts of the brazing material discharged outside the laminated assembly along the scribe lines are substantially the same on the front surface and the back surface in the step of joining. Thereby the content amount of the Si atoms i.e., the Si density dispersed in the metal boards joined on the front surface and the back surface are the same and the etching rate etching the metal boards are the same, so that the same size of the metal layers can be formed.

In the method for manufacturing the ceramic-metal layer assembly, it is applicable that the scribe lines on the front surface of the ceramic base material board and the scribe lines on the back surface of the ceramic base material board be formed at a same position in the surface direction of the ceramic base material board.

By forming the scribe lines on the same position on both the face of the ceramic base material board, it is easy to split the ceramic base material board into pieces along the scribe lines, so that a plurality of ceramic circuit boards can be efficiently manufactured.

In the method of manufacturing the ceramic-metal layer assembly of the present invention, the positions may be different between the scribe lines formed on the front surface of the ceramic base material board and the scribe lines formed on the back surface of the ceramic base material board in the surface direction of the ceramic base material board.

According to the above-described structure, since the number of the scribe lines can be less than the number of the scribe lines which are formed on the same position on both the surfaces of the ceramic base material board, it is possible to reduce works and time for the step of forming scribe lines.

A method for manufacturing a ceramic circuit board of the present invention further includes a step of dividing after the step of etching in the above-described method for manufacturing, dividing the ceramic base material board along the scribe lines into pieces of the ceramic boards, so that the ceramic circuit boards in which the metal layers are joined respectively on the front surface and the back surface of the ceramic boards are manufactured.

A metal-board-joined ceramic base material board of the present invention is provided with: a ceramic base material board having at least one scribe line on each of a front surface and a back surface, in which the scribe lines are formed along dividing lines for dividing the ceramic base material board into a plurality of ceramic boards; and metal boards joined respectively on the front surface and the back surface of the ceramic base material board, in which the metal boards cover at least a part of dividing lines and are made of aluminum with a thickness dimension not more than 0.4 mm.

In the metal-board-joined ceramic base material board of the present invention, a plurality of the scribe lines may be formed respectively on the front surface and the back surface of the ceramic base material board.

In the metal-board-joined ceramic base material board of the present invention, the scribe lines formed on the front surface of the ceramic base material board and the scribe lines formed on the back surface of the ceramic base material board may be a same number.

In the metal-board-joined ceramic base material board of the present invention, the scribe lines on the front surface of the ceramic base material board and the scribe line on the back surface of the ceramic base material board may be formed at a same position in the surface direction of the ceramic base material board.

In the metal-board-joined ceramic base material board of the present invention, the scribe lines on the front surface of the ceramic base material board and the scribe line on the back surface of the ceramic base material board may be formed at different positions in the surface direction of the ceramic base material board.

Advantageous Effects of Invention

According to the present invention, since the difference of the Si density can be reduced between the metal boards joined on the surfaces of the ceramic board, the etching rate can be substantially the same for both the metal boards; and the braze stain generated on the surfaces of the metal boards can be suppressed.

DESCRIPTION OF EMBODIMENTS

Below, embodiments of the present invention will be explained with drawings.

First Embodiment

Figure 1:
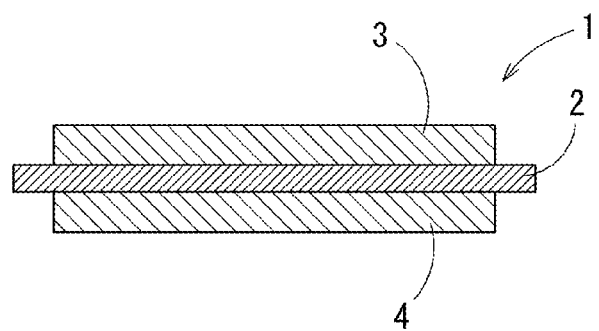
FIG. 1 It is a cross sectional view showing a cross section of a ceramic circuit board according to a first embodiment of the present invention.

FIG. 1 is a sectional view showing a ceramic circuit board 1 of a first embodiment. The ceramic circuit board 1 is used as a wiring board of a thermoelectric conversion element for instance, and provided with a ceramic board 2 formed in a rectangular shape having a vertical dimension of 5 mm and a horizontal dimension of 5 mm in a plan view and metal layers 3 and 4 that are joined on both surfaces of the ceramic board 2.

The ceramic board 2 is a material board made of a ceramic material such as aluminum nitride (AlN), silicon nitride ($Si_3N_4$), alumina or the like with a thickness L1 (refer to FIG. 6) of 0.3 mm to 1.0 mm.

The metal layers 3 and 4 are material boards made of pure aluminum of purity not less than 99.00% by mass, pure aluminum of purity not less than 99.99% by mass, or aluminum alloy of JIS3003 or the like with a thickness not more than 0.4 mm (e.g., 0.25 mm).

The metal layers 3 and 4 and the ceramic board 2 are joined with brazing material of Al—Si base.

Figure 3A:
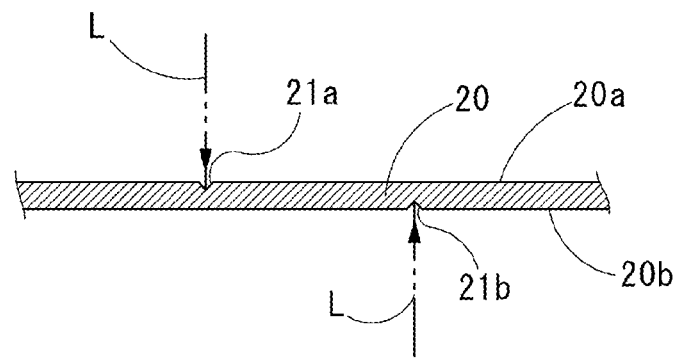
FIG. 3A It is a cross sectional view showing a step of forming scribe lines in the method for manufacturing the ceramic circuit board in the first embodiment.
Figure 4:
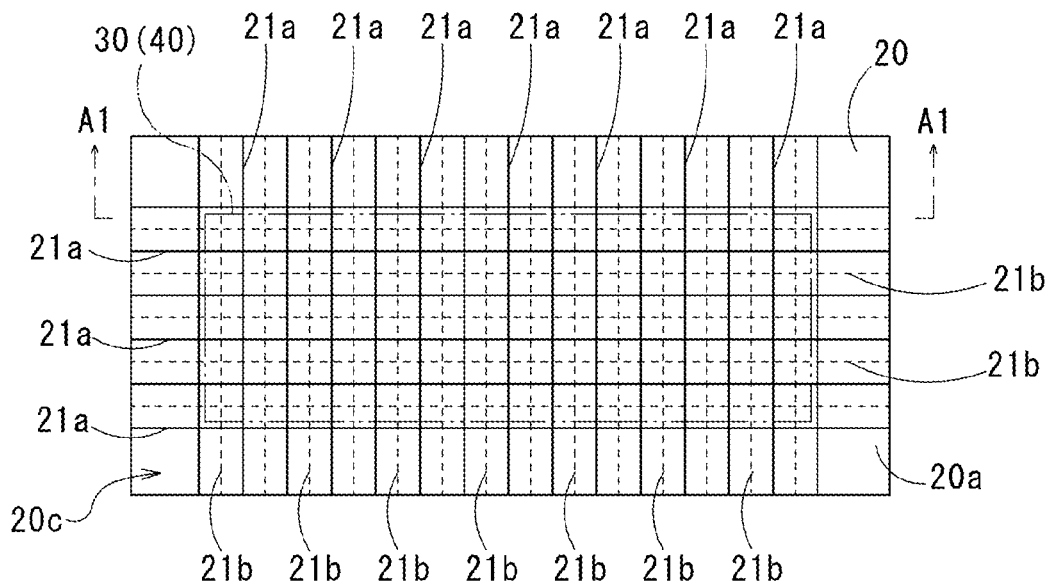
FIG. 4 It is a plan view of a ceramic base material board on which the scribe lines are formed in the first embodiment.

A method for manufacturing the ceramic circuit board 1 structured as above will be explained. In this manufacturing method, a ceramic base material board 20 with a size which can be formed into the multiple ceramic boards 2 of the ceramic circuit board 1 is prepared: scribe lines 21a are formed on a front surface 20a and scribe lines 21b are formed on a back surface 20b of the ceramic board 2 as shown in FIG. 3A and FIG. 4 (a step of forming scribe lines).

Figure 3B:
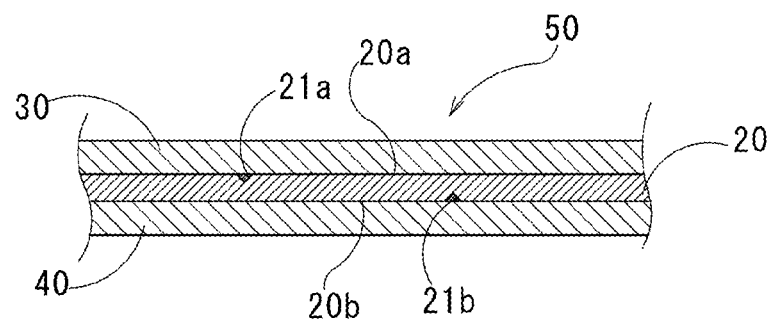
FIG. 3B It is a cross sectional view showing a step of joining in the method for manufacturing the ceramic circuit board in the first embodiment.

Then, metal boards 30 and 40 to be the metal layers 3 and 4 are joined on both the surfaces of the ceramic base material board 20 as shown in FIG. 3B (a step of joining), so that a metal-board-joined ceramic base material board (hereinafter, a first joined assembly) 50 is formed.

Figure 3C:
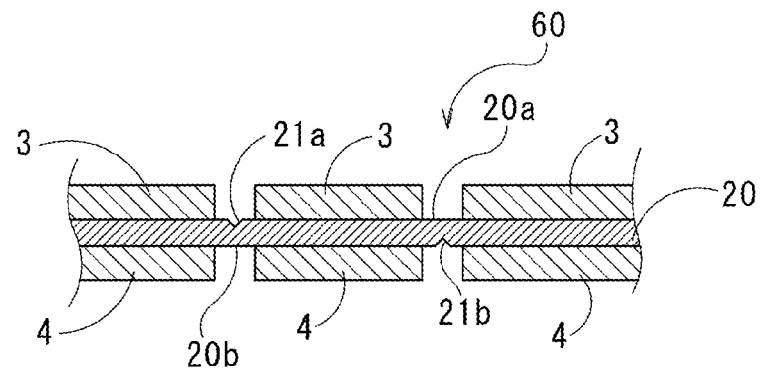
FIG. 3C It is a cross sectional view showing a step of etching in the method for manufacturing the ceramic circuit board in the first embodiment.

Then, the metal boards 30 and 40 of the first joined assembly 50 are etched along dividing lines (the scribe lines 21a and 21b) as shown in FIG. 3C (a step of etching), so that ceramic-metal layer assembly (hereinafter, a second joined assembly) 60 is manufactured.

Figure 3D:
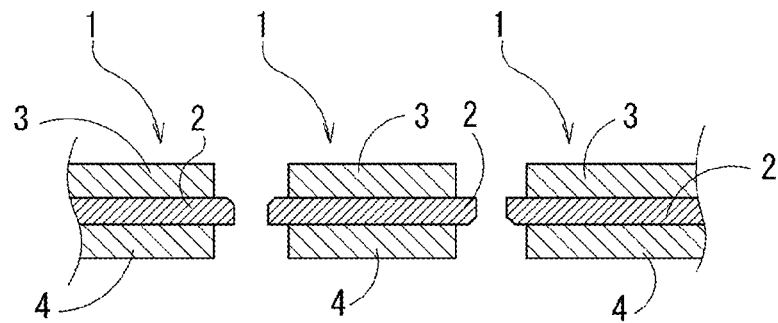
FIG. 3D It is a cross sectional view showing a step of dividing in the method for manufacturing the ceramic circuit board in the first embodiment.

Furthermore, after plating the second joined assembly 60 (a step of plating), the ceramic base material board 20 is divided into pieces as shown in FIG. 3D (a step of dividing), so that the ceramic circuit board 1 are manufactured.

Figure 2:
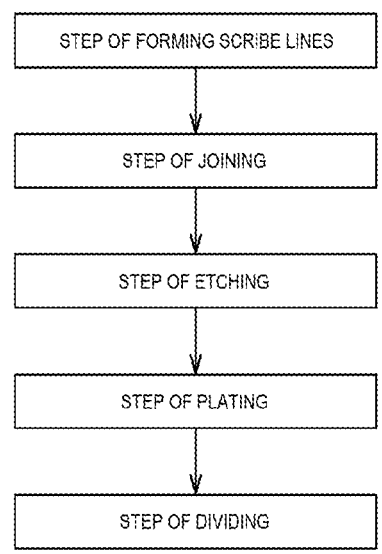
FIG. 2 It is a flow diagram showing a method of manufacturing the ceramic circuit board in the first embodiment.

Below, the step of forming scribe lines, the step of joining, the step of etching, the step of plating and the step of dividing which are carried out in order as shown in FIG. 2, will be explained in detail in order.

——Step of Forming Scribe Lines——

As shown in FIG. 3A, the scribe lines 21a on the front surface 20a and the scribe lines 21b on the back surface 20b are formed along the dividing lines which divide the ceramic base material board 20 with a rectangular board shape into the multiple ceramic boards 2.

The scribe lines 21a and 21b are groove parts formed on the ceramic base material board 20, formed by removing the front surface 20a and the back surface 20b of the ceramic base material board 20 linearly, by emitting laser light L ($CO_2$ laser, YAG laser, $YVO_4$ laser, YLF laser or the like) for instance. The scribe lines 21a and 21b are starting parts of dividing the ceramic base material board 20 in the step of dividing, formed on at least one of the front surface 20a or the back surface 20b of the ceramic base material board 20 along the dividing lines.

Figure 5:
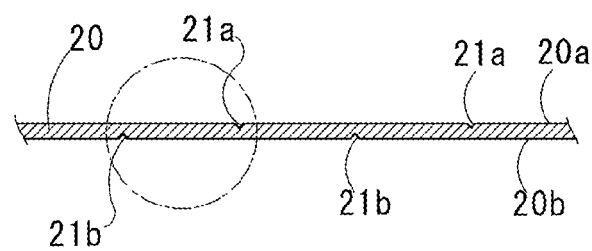
FIG. 5 It is a cross sectional arrow view showing a part of a cross section of the ceramic base material board sectioned at the line A1-A1 shown in FIG. 4 in the first embodiment.

FIG. 4 is a plan view of the ceramic base material board 20 on which the scribe lines 21a and 21b are formed by the step of forming scribe lines. FIG. 5 is a cross sectional arrow view showing a part of a cross section along the line A1-A1 shown in FIG. 4.

As shown in FIG. 4 by solid lines, formed by the step of forming scribe lines on the front surface 20a of the ceramic base material board 20 are: the fifteen scribe lines 21a extending vertically, and substantially in parallel with a prescribed interval to each other, and the six scribe lines 21a extending laterally, and substantially in parallel with a prescribed interval to each other.

On the other side, as shown in FIG. 4 by broken lines, formed by the step of forming scribe lines on the back surface 20b of the ceramic base material board 20 are: the fourteen scribe lines 21b extending vertically, and substantially in parallel with a prescribed interval to each other, and the five scribe lines 21b extending laterally, and substantially in parallel with a prescribed interval to each other.

The respective scribe lines 21b extending vertically on the back surface 20b are formed substantially in parallel to the scribe lines 21a extending vertically on the front surface 20a but on different positions from them; that is to say, formed between the scribe lines 21a on the front surface 20a. Moreover, the respective scribe lines 21b extending laterally on the back surface 20b are formed substantially in parallel to the six scribe lines 21a extending laterally on the front surface 20a but on different positions from them; that is to say, formed between the scribe lines 21a on the front surface 20a.

Specifically, the interval between the respective scribe lines 21a on the front surface 20a and the interval between the respective scribe lines 21b on the back surface 20b of the ceramic base material board 20 are both 10 ming the scribe lines 21a on the front surface 20a and the scribe lines 21b on the back surface 20b are disposed with being shifted by 5 mm to each other in a surface direction of the ceramic base material board 20. Accordingly, in a plan view of the ceramic base material board 20, the scribe lines 21a on the front surface 20a and the scribe lines 21b on the back surface 20b are disposed with a pitch 5 mm in the vertical direction and the lateral direction respectively.

Thereby the 280 ceramic boards 2 are formed with 5 mm square in a plan view, by dividing the ceramic base material board 20 along the scribe lines 21a and 21b on the dividing lines in the step of dividing.

In addition, a peripheral end part of the ceramic base material board 20 (parts between end edges of the ceramic base material board 20 and the outermost scribe lines 21a and 21b) are a margin part 20c, which is not used as the ceramic board 2 (refer to FIG. 4). Accordingly, although the dividing lines forming the outline of the ceramic board 2 are not set in the margin part 20c, the scribe lines 21a and 21b are formed to be extended into the margin part 20c, in order to divide the ceramic base material board 20 without breaking the ceramic board 2.

Figure 6:
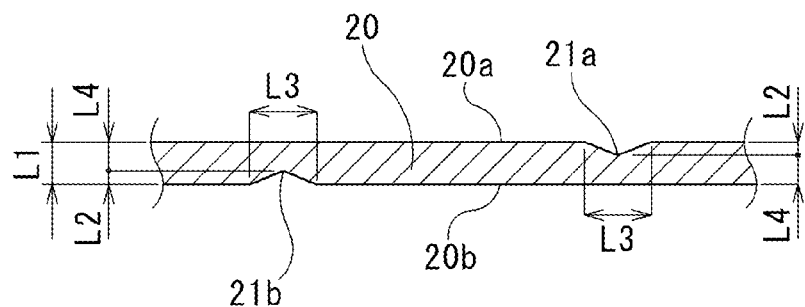
FIG. 6 It is a partially enlarged cross sectional view showing a part of the ceramic base material board with enlarging in the first embodiment.

FIG. 6 is a partly enlarged view of FIG. 5. The scribe lines 21a and 21b are formed to have a depth dimension L2 and a maximum width dimension L3 respectively on the front surface 20a and the back surface 20b of the ceramic base material board 20 with a thickness dimension L1. Accordingly, a thickness dimension L4 of the ceramic base material board 20 along the dividing lines on which the scribe lines 21a and 21b are formed is smaller than the thickness L1 of the ceramic base material board 20 at a part on which the scribe lines 21a and 21b are not formed.

Specifically, it is preferable that the depth dimension L2 of the scribe lines 21a and 21b be 0.1 mm to 0.3 mm and the width dimension L3 be 0.05 mm to 0.2 mm. In the present embodiment, L1 is set to 0.635 mm, L2 is set to 0.2 mm, L3 is set to 0.1 mm, and L4 is set to 0.435 mm.

It is preferable to form the scribe lines 21a and 21b so that at least one end part thereof reach the end edge (the margin part 20c which is an outer part of the metal boards 30 and 40) of the ceramic base material board 20. In a case of not forming both end parts of the scribe lines 21a and 21b to reach the end edge (the margin part 20c) of the ceramic base material board 20, it is not possible to run the brazing material which is melted in the step of joining via the scribe lines to the outside.

By forming the scribe lines 21a and 21b to reach the margin part 20c which is the outer side than the metal boards 30 and 40, surpluses of the melted brazing material between the ceramic base material board 20 and the metal boards 30 and 40 can be easily flown outside. In the present embodiment, the scribe lines 21a and 21b are formed to reach both the end edges of the ceramic base material board 20.

In a case in which the other ends of the scribe lines 21a and 21b do not reach the end edge parts of the ceramic base material board 20, it is good that a distance between the other ends of the scribe lines 21a and 21b and the end edges is small as not to obstruct the division of the ceramic base material board 20 by the scribe lines 21a and 21b.

After forming the scribe lines 21a and 21b, the ceramic base material board 20 is washed by washing solution but the illustration is omitted.

——Step of Joining——

Next, as shown in FIG. 3B, the metal boards 30 and 40 (refer to FIG. 4) having a thickness not more than 0.4 mm and a size (substantially a same size as inside the margin part 20c in the present embodiment) covering at least a part of the scribe lines 21a and 21b (the dividing lines) in a plan view are joined on the ceramic base material board 20 which is washed after forming the scribe lines 21a and 21b using brazing material of Al—Si base.

Specifically, the metal boards 30 and 40 are layered on the front surface 20a and the back surface 20b of the ceramic base material board 20 respectively with foils of brazing material of Al—Si base therebetween; and a laminated assembly of these is held between carbon plates and pressurized in a laminate direction and heated in vacuum (in a state of pressurizing). Thereby the metal-board-joined ceramic base material board (the first joined assembly) 50 is formed (refer to FIG. 3B) in which the metal boards 30 and 40 are joined on the front surface 20a and the back surface 20b of the ceramic base material board 20 respectively.

In the step of joining, it is preferable that the pressurizing force in the laminate direction be 0.1 MPa to 0.5 MPa and heating temperature be 630° C. to 650° C. It is preferable that the foils of brazing material of Al—Si base have a thickness 5 μm to 15 μm. However, the heating temperature is lower than a melting point of the metal boards 30 and 40. For the Al—Si base brazing material, Al—Si—Cu brazing material and Al—Si—Mg brazing material or the like can be used. It is desirable that Si density in the brazing material be 5% by mass to 12% by mass.

The brazing material is melted when joining and flows out partly: the remainder is entirely or mostly used for brazing and dispersed into the metal boards 30 and 40. Accordingly, there is a case in which a slight brazing material layer remains between the ceramic base material board 20 and the metal boards 30 and 40 after joining, or a case of scarcely remains.

In the present embodiment, as described above, the scribe lines 21a are formed on the front surface 20a with fifteen vertically and six laterally: and the scribe lines 21b are formed on the back surface 20b with fourteen vertically and five laterally. These numbers of the scribe lines 21a and 21b can be deemed to be substantially the same between the front surface 20a and the back surface 20b.

Therefore, quantities of the brazing material that flows outside the metal boards 30 and 40 along the scribe lines 21a and 21b in the step of joining are substantially the same quantity at both the surfaces of the ceramic base material board 20. Accordingly, the brazing material remains between the metal boards 30 and 40 and the ceramic base material board 20, and the quantities thereof are substantially the same on the front surface 20a and the back surface 20b. Thereby substantially the same amount of the Si atoms are dispersed into the metal boards 30 and 40 respectively, so that Si density in the metal boards 30 and 40 are substantially the same.

Moreover, since the melted brazing material is discharged outside the laminated assembly along the scribe lines 21a and 21b, increase of the Si density resulting from remaining of the brazing material is suppressed, so that the melting point of the metal boards 30 and 40 is prevented from falling: as a result, braze stains on surfaces of the metal boards 30 and 40 are reduced.

——Step of Etching——

Then, the metal boards 30 and 40 in the first joined assembly 50 are etched along the dividing lines (the scribe lines 21a and 21b). Etching can be carried out by known methods, for example, a method using iron chloride solution after masking necessary parts. The scribe lines 21a and 21b are exposed by etching and a plurality of the metal layers 3 and 4 are formed which are isolated from each other in a rectangular shape in a plan view, so that the metal-layer-joined ceramic base material board (the second joined assembly) 60 is formed (refer to FIG. 3C).

In the step of etching, the metal board 30 joined on the front surface 20a and the metal board 40 joined on the back surface 20b of the ceramic base material board 20 have substantially the same etching rate since the Si density are the same; accordingly etching widths are also substantially the same. Thereby the second joined assembly 60 having the metal layers 3 and 4 with substantially the same size between the dividing lines is formed.

——Step of Plating——

Although illustration is omitted, plating treatment(s) such as gold plating, silver plating, nickel plating and the like are carried out on the second joined assembly 60 if necessary. Thereby the metal layers 3 and 4 in the second joined assembly 60 are plated. In addition, both surfaces of the second joined assembly 60 are plated in the present embodiment: however, it is applicable that only one surface is plated, for instance.

——Step of Dividing——

Lastly, in the second joined assembly 60, the ceramic base material board 20 which is exposed along the scribe lines 21a and 21b (the dividing lines) by the etching is split along the scribe lines 21a and 21b (the dividing lines) into pieces of the ceramic boards 2, so that a plurality (280 pieces) of the ceramic circuit boards 1 are manufactured as shown in FIG. 3D.

In addition, after the step of joining, on an outermost field of the ceramic base material board 20 (refer to FIG. 4, the outer field than the scribe lines 21a and 21b that are nearest to the outer edge of the ceramic base material board 20), i.e., on the margin part 20c that is not used as the ceramic board 2, braze lumps are generated by the brazing material that is melted and flown out in the step of joining and then solidified. These braze lumps are removed before the step of dividing because they obstruct the division of the ceramic base material board 20.

As explained above, in the method of manufacturing the ceramic circuit board 1 according to the present embodiment, the scribe lines 21a and 21b are formed with the same number on both surfaces of the ceramic base material board 20, the front surface 20a and the back surface 20b: accordingly, when the laminated assembly in which the metal boards 30 and 40 are piled is joined using the brazing material, both on the front surface 20a and the back surface 20b of the ceramic base material board 20, the same quantity of the melted braze material is discharged outside the laminated assembly (the metal boards 30 and 40) along the scribe lines 21a and 21b. Accordingly, a content amount of the Si atoms (the Si density) dispersed from the brazing material into the metal board 30 at the front surface 20a side and a content amount of the Si atoms (the Si density) dispersed from the brazing material into the metal board 40 at the back surface 20b side are substantially the same: as a result, the metal boards 30 and 40 can be etched with the same etching rate, so that the metal layers 3 and 4 having substantially the same size are formed.

By the scribe lines 21a and 21b formed respectively on the front surface 20a and 20b of the ceramic base material board 20, the brazing material melted in the step of joining is dispersed and discharged outside the laminated assembly on both the front surface 20a and the back surface 20b, so that the Si density can be even in the metal boards 30 and 40 and generation of the braze stains on the surfaces of the metal boards 30 and 40 can be suppressed.

Furthermore, the brazing material melted is spread from the laminated assembly of the ceramic base material board 20 and the metal boards 30 and 40 via the plurality of the scribe lines 21a and 21b and discharged outside the laminated assembly; so that the braze lumps can be prevented from growing larger.

In addition, in this embodiment, since the scribe lines 21a and 21b are formed with being distributed to the front surface 20a and the back surface 20b of the ceramic base material board 20, i.e., since the scribe lines 21a and 21b are formed along the dividing lines on one of the front surface 20a and the back surface 20b of the ceramic base material board 20; comparing with a third embodiment (a case in which scribe lines are formed coinciding with each other on both the surfaces of the ceramic base material board 20) which will be mentioned below, the number of the scribe lines 21a and 21b can be halved, so it is possible to reduce works and time for the step of forming scribe lines.

In addition, in the above-mentioned first embodiment, the scribe lines 21a are formed on the front surface 20a of the ceramic base material board 20 with fifteen vertically and six laterally and the scribe line 21b are formed on the back surface 20b with fourteen vertically and five laterally, but it is not limited to this.

Second Embodiment

Figure 7:
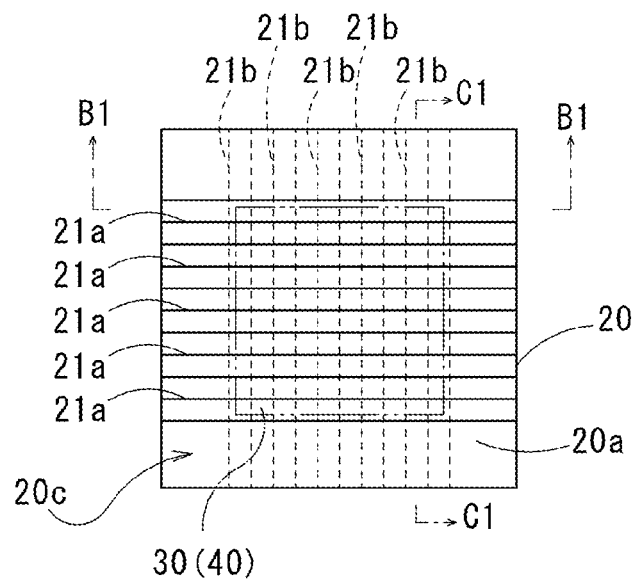
FIG. 7 It is a plan view of a ceramic base material board on which scribe lines are formed according to a second embodiment of the present invention.
Figure 8:
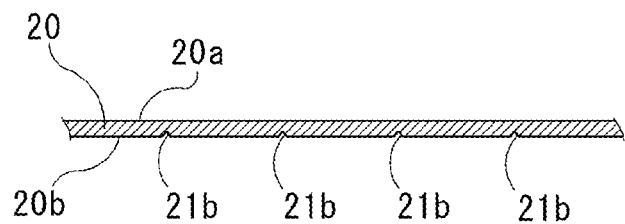
FIG. 8 It is a cross sectional arrow view showing a part of a cross section of the ceramic base material board sectioned at the line B1-B1 shown in FIG. 7 in the second embodiment.
Figure 9:
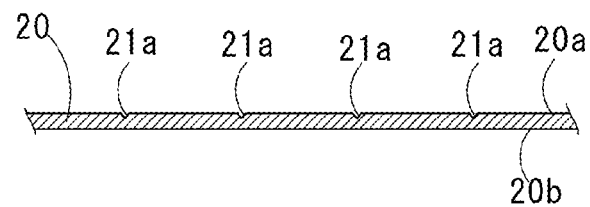
FIG. 9 It is a cross sectional arrow view showing a part of a cross section of the ceramic base material board sectioned at the line C1-C1 shown in FIG. 7 in the second embodiment.

FIG. 7 is a plan view of the ceramic base material board 20 on which the scribe lines 21a and 21b are formed according to a second embodiment. FIG. 8 is a cross sectional arrow view showing a part of a cross section of the ceramic base material board 20 along the line B1-B1 in FIG. 7. FIG. 9 is a cross sectional arrow view showing a part of a cross section of the ceramic base material board 20 along the line C1-C1 in FIG. 7.

In the present embodiment, the scribe lines 21b along a vertical direction and the scribe lines 21a along a lateral direction are separately formed on the front surface 20a and the back surface 20b of the ceramic base material board 20. That is to say, on the front surface 20a of the ceramic base material board 20 with substantially a square shape in the plan view, as shown in FIG. 7 and FIG. 9, the eleven scribe lines 21a extending laterally are disposed with a prescribed interval. Moreover, on the back surface 20b of the ceramic base material board 20, as shown in FIG. 7 and FIG. 8, the eleven scribe lines 21b extending vertically are disposed with a prescribed interval. The scribe lines 21a and 21b are disposed with a pitch of 5 mm respectively, by dividing the ceramic base material board 20 along the scribe lines 21a and 21b, the 100 ceramic boards 2 of 5 mm square in the plan view can be formed.

In the present embodiment, extension directions of the scribe lines 21a and 21b are set to be one direction respectively as the lateral direction on the front surface 20a and the vertical direction on the back surface 20b: accordingly, it is possible to reduce the works and time for a forming step (the step of forming scribe lines) of the scribe lines 21a and 21b.

Moreover, in the present embodiment, the number of the scribe lines 21a formed on the front surface 20a and the number of the scribe lines 21b formed on the back surface 20b are the same. Accordingly, when the laminated assembly in which the metal boards 30 and 40 are laminated using the brazing material on both the front surface 20a and the back surface 20b of the ceramic base material board 20, is bonded by heating with pressurizing in the lamination direction, the melted braze material is discharged outside the laminated assembly with the same quantity on both the front surface 20a and the back surface 20b along the same number of the scribe lines 21a and 21b. Thereby the content amount of the Si atoms in the brazing material dispersed into the metal board 30 at the front surface 20a side and the content amount of the Si atoms dispersed into the metal board 40 at the back surface 20b side of the ceramic base material board 20 are the same. That is to say, since the Si density is the same in the metal board 30 at the front surface 20a side and the metal board 40 at the back surface 20b side of the ceramic base material board 20, it is possible to etch with the same etching rate, and the metal layers 3 and 4 can be formed with a same size.

In the above embodiments 1 and 2, the scribe lines 21a formed on the front surface 20a and the scribe lines 21b formed on the back surface 20b of the ceramic base material board 20 are disposed at different positions in the surface direction of the ceramic base material board 20: however, it is not limited to this.

Third Embodiment

Figure 10:
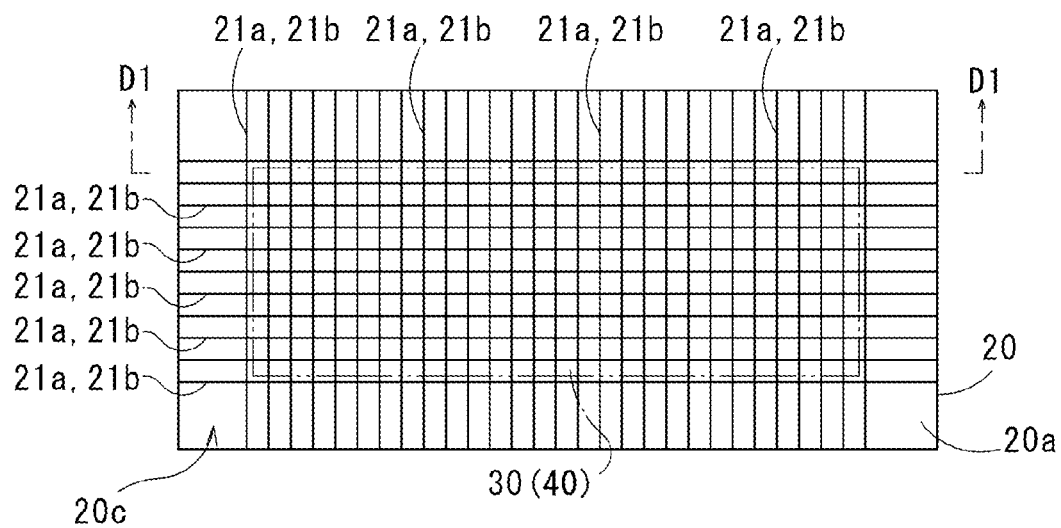
FIG. 10 It is a plan view of a ceramic base material board on which scribe lines are formed according to a third embodiment of the present invention.
Figure 11:
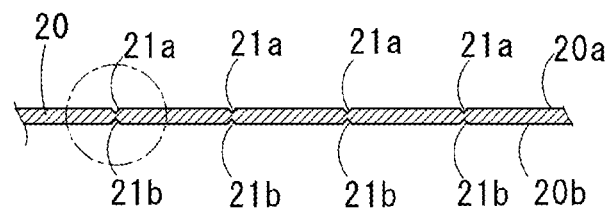
FIG. 11 It is a cross sectional arrow view showing a part of a cross section of a ceramic base material board sectioned at the line D1-D1 shown in FIG. 10 in the third embodiment.
Figure 12:
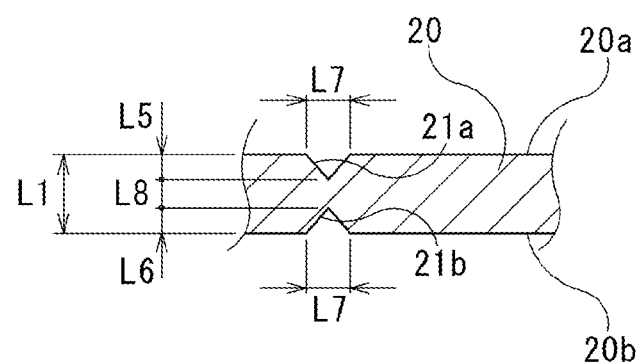
FIG. 12 It is a partially enlarged cross sectional view showing a part of the ceramic base material board with enlarging in the third embodiment.

FIG. 10 is a plan view of the ceramic base material board 20 on which the scribe lines 21a and 21b according to a third embodiment are formed. FIG. 11 is a cross sectional arrow view showing a part of a cross section of the ceramic base material board 20 along the line D1-D1 in FIG. 10. FIG. 12 is a partial enlarged view of the ceramic base material board 20 shown in FIG. 11.

In the present embodiment, the scribe lines 21a on the front surface 20a and the scribe lines 21b on the back surface 20b are formed on a same position along the dividing lines. That is to say, on the front surface 20a of the ceramic base material board 20, as shown in FIG. 10 and FIG. 11, the 29 scribe lines 21a extending in the vertical direction and the 11 scribe lines 21a extending in the lateral direction are formed with a prescribed interval respectively. Moreover, on the back surface 20b of the ceramic base material board 20, the 29 scribe lines 21b extending in the vertical direction and the 11 scribe lines 21b extending in the lateral direction are formed with a prescribed interval respectively so as to be opposite to the scribe lines 21a formed on the front surface 20a. In other words, the 40 scribe lines 21a arranged on the front surface 20a and the 40 scribe lines 21b arranged on the back surface 20b are formed double.

In this case, as shown in FIG. 12, a depth L5 of the scribe lines 21a and a depth L6 of the scribe lines 21b are set to have a same dimension. A thickness dimension L8 in the dividing lines on which the scribe lines 21a and 21b are formed in the ceramic base material board 20 is smaller than the thickness dimension L1 of the ceramic base material board 20 in which the scribe lines 21a and 21b are not formed.

In the present embodiment, since the scribe lines 21a and the scribe lines 21b are formed at the same position on the front surface 20a and the back surface 20b, the depth L5 of the scribe lines 21a and the depth L6 of of the scribe lines 21b are set to be smaller than the depth dimension L2 of the scribe lines 21a and 21b in the first embodiment, and the thickness dimension L8 on the dividing lines is set to be substantially the same as the thickness dimension L4 on the dividing lines in the first embodiment. In the present embodiment, L1 is set to 0.635 mm, L5 and L6 are set to 0.1 mm, L7 is set to 0.1 mm, and L8 is set to 0.435 mm.

According to this structure, since the scribe lines 21a on the front surface 20a and the scribe lines 21b on the back surface 20b are formed opposite to each other on the same dividing lines in the ceramic base material board 20, the ceramic base material board 20 is easy to be split. Moreover, the ceramic base material board 20 can be easily split along the scribe lines 21a and 21b even if whichever surfaces of the front surface 20a or the back surface 20b is an upside.

In the aforementioned first embodiment, the scribe lines 21a and 21b are formed on the front surface 20a with 21 lines, on the back surface 20b with 19 lines, so that the scribe lines 21a or the scribe lines 21b are formed only one of the front and back surfaces along the dividing lines. On the other hand, in the third embodiment, a same number of the 40 scribe lines 21a and 21b are respectively formed on both the surfaces of the ceramic base material board 20 along the dividing lines, so that it is more easier to operate the dividing works than in the first embodiment.

In addition, the present invention is not limited to the above-described embodiments and various modifications may be made without departing from the scope of the present invention.

In the above-described embodiments, the multiple scribe lines 21a and 21b are formed respectively on the front surface 20a and the back surface 20b though, it is not limited to this: for instance, it is applicable that the one scribe line 21a is formed on the front surface 20a and a plurality of the scribe lines 21b are formed on the back surface 20b; or the scribe lines 21a and 21a may be formed on the front surface 20a and 20b one by one.

That is to say, in the present invention, it is enough that the one or more scribe lines 21a and 21b are formed respectively on the front surface 20a and the back surface 20b of the ceramic base material board 20.

For instance, when the scribe lines are formed one by one on the front surface 20a and the back surface 20b of the ceramic base material board 20, even though the braze lumps generated on the ends of the scribe lines are large, the melted braze material can be discharged only at parts where the scribe lines are formed. That is to say, positions where the braze lumps are generated can be controlled.

In the above mentioned first and second embodiments, the scribe lines 21a and 21b are arranged with 10 mm interval respectively; and in the above mentioned third embodiment, the scribe lines 21a and 21b are arranged with 5 mm interval respectively, but it is not limited to this: the intervals of the scribe lines 21a and 21b can be appropriately modified in accordance with the size of the ceramic circuit board 1. The size of the ceramic base material board 20 can also appropriately be modified.

In the above mentioned embodiments, the ceramic circuit boards 1 are divided after the plating treatment though, it is not limited to this; the plating treatment may be carried out on the ceramic circuit boards 1 after the step of dividing. Moreover, the step of plating is not always necessary.

Moreover, in the above-mentioned embodiments, the scribe lines 21a and 21b are formed by laser beam machining, but it is not limited to this; the other working methods such as a diamond scriber and the like can be carried out, for instance.

INDUSTRIAL APPLICABILITY

According to the present invention, it is possible to reduce the difference of the Si density between the metal boards joined on the surfaces of the ceramic board, so that the etching rates of the metal boards can be substantially the same, and the generation of the braze stain generated on the surfaces of the metal board can be reduced.

DESCRIPTION OF THE REFERENCE SYMBOLS

1 Ceramic Circuit Board
2 Ceramic Board
3, 4 Metal Layer
20 Ceramic Base Material Board
20a Front Surface
20b Back Surface
20c Margin Part
21a, 21b Scribe Line
30, 40 Metal Board
50 Metal-board-joined ceramic Base Material Board (First Joined Assembly)
60 Ceramic-Metal Layer Assembly (Second Joined Assembly)

The invention claimed is:

1. A metal-board-joined ceramic base material board comprising:
    a ceramic base material board having at least one scribe line on each of a front surface and a back surface, wherein the scribe lines are formed along dividing lines for dividing the ceramic base material board into a plurality of ceramic boards; and
    metal boards joined respectively on the front surface and the back surface of the ceramic base material board, wherein the metal boards cover at least a part of dividing lines and are made of aluminum or aluminum alloy with a thickness dimension not more than 0.4 mm.

2. The metal-board-joined ceramic base material board according to claim 1, wherein a plurality of the scribe lines are formed respectively on the front surface and the back surface of the ceramic base material board.

3. The metal-board-joined ceramic base material board according to claim 2, wherein the scribe lines on the front surface of the ceramic base material board and the scribe line on the back surface of the ceramic base material board are formed at different positions in a surface direction of the ceramic base material board.

4. The metal-board-joined ceramic base material board according to claim 1, wherein the scribe lines formed on the front surface of the ceramic base material board and the scribe lines formed on the back surface of the ceramic base material board are a same number.

5. The metal-board-joined ceramic base material board according to claim 4, wherein the scribe lines on the front surface of the ceramic base material board and the scribe line on the back surface of the ceramic base material board are formed at a same position in a surface direction of the ceramic base material board.

6. The metal-board-joined ceramic base material board according to claim 4, wherein the scribe lines on the front surface of the ceramic base material board and the scribe line on the back surface of the ceramic base material board are formed at different positions in a surface direction of the ceramic base material board.

7. The metal-board-joined ceramic base material board according to claim 1, wherein the scribe lines on the front surface of the ceramic base material board and the scribe line on the back surface of the ceramic base material board are formed at a same position in a surface direction of the ceramic base material board.

8. The metal-board-joined ceramic base material board according to claim 1, wherein the scribe lines on the front surface of the ceramic base material board and the scribe line on the back surface of the ceramic base material board are formed at different positions in a surface direction of the ceramic base material board.

9. A method for manufacturing a ceramic-metal layer assembly comprising
    a step of forming scribe lines, forming at least one scribe line respective on a front surface and a back surface of a ceramic base material board along dividing lines for dividing the ceramic base material board into a plurality of ceramic boards;
    a step of joining, laminating a metal board made of aluminum or aluminum alloy with a thickness dimension of not more than 0.4 mm respective on each of the front surface and the back surface of the ceramic base material board with Al—Si base brazing material therebetween so as to cover at least a part of the dividing lines, and heating with pressurizing in a laminating direction; so that the metal boards are joined respectively on the front surface and the back surface of the ceramic base material board; and
    a step of etching, forming a plurality of metal layers by etching the metal boards along the dividing lines,
    so that manufacturing the ceramic-metal layer assembly wherein the plurality of metal layers are joined respectively on the front surface and the back surface of the ceramic base material board.

10. The method for manufacturing the ceramic-metal layer assembly according to claim 9, wherein in the step of forming scribe lines, the plural scribe lines are formed respectively on the front surface and the back surface of the ceramic base material board.

11. The method for manufacturing the ceramic-metal layer assembly according to claim 10, wherein in the step of forming scribe lines, the scribe lines on the front surface of the ceramic base material board and the scribe lines on the back surface of the ceramic base material board are formed at different positions in a surface direction of the ceramic base material board.

12. The method for manufacturing the ceramic-metal layer assembly according to claim 9, wherein in the step of forming scribe lines, the scribe lines that are formed on the front surface of the ceramic base material board and the scribe lines that are formed on the back surface of the ceramic base material board are a same number.

13. The method for manufacturing the ceramic-metal layer assembly according to claim 12, wherein in the step of forming scribe lines, the scribe lines on the front surface of the ceramic base material board and the scribe lines on the back surface of the ceramic base material board are formed at a same position in a surface direction of the ceramic base material board.

14. The method for manufacturing the ceramic-metal layer assembly according to claim 12, wherein in the step of forming scribe lines, the scribe lines on the front surface of the ceramic base material board and the scribe lines on the back surface of the ceramic base material board are formed at different positions in a surface direction of the ceramic base material board.

15. The method for manufacturing the ceramic-metal layer assembly according to claim 9, wherein in the step of forming scribe lines, the scribe lines on the front surface of the ceramic base material board and the scribe lines on the back surface of the ceramic base material board are formed at a same position in a surface direction of the ceramic base material board.

16. The method for manufacturing the ceramic-metal layer assembly according to claim 9, wherein in the step of forming scribe lines, the scribe lines on the front surface of the ceramic base material board and the scribe lines on the back surface of the ceramic base material board are formed at different positions in a surface direction of the ceramic base material board.

17. A method for manufacturing ceramic circuit boards,
further comprising a step of dividing after the step of etching in the method for manufacturing according to claim 9, dividing the ceramic base material board along the scribe lines into plural pieces of the ceramic boards,
so that manufactured are the ceramic circuit boards wherein the metal layers are joined respectively on the front surface and the back surface of the ceramic boards.

\* \* \* \* \*